United States Patent
Xue et al.

(10) Patent No.: US 12,501,719 B2
(45) Date of Patent: Dec. 16, 2025

(54) THIN-FILM TRANSISTOR AND PREPARATION METHOD THEREFOR, AND DISPLAY SUBSTRATE AND DISPLAY PANEL

(71) Applicants: Fuzhou BOE Optoelectronics Technology Co., Ltd., Fujian (CN); BOE Technology Group Co., Ltd., Beijing (CN)

(72) Inventors: Dapeng Xue, Beijing (CN); Zheng Liu, Beijing (CN); Hehe Hu, Beijing (CN); Lizhong Wang, Beijing (CN); Shuilang Dong, Beijing (CN); Nianqi Yao, Beijing (CN)

(73) Assignees: Fuzhou BOE Optoelectronics Technology Co., Ltd., Fujian (CN); Beijing BOE Technology Development Co., Ltd., Beijing (CN)

( * ) Notice: Subject to any disclaimer, the term of this patent is extended or adjusted under 35 U.S.C. 154(b) by 590 days.

(21) Appl. No.: 17/905,246

(22) PCT Filed: Mar. 19, 2020

(86) PCT No.: PCT/CN2020/080260
§ 371 (c)(1),
(2) Date: Aug. 29, 2022

(87) PCT Pub. No.: WO2021/184312
PCT Pub. Date: Sep. 23, 2021

(65) Prior Publication Data
US 2023/0110228 A1    Apr. 13, 2023

(51) Int. Cl.
*H10D 99/00* (2025.01)
*H10D 30/67* (2025.01)
(Continued)

(52) U.S. Cl.
CPC ......... *H10D 99/00* (2025.01); *H10D 30/6704* (2025.01); *H10D 64/01* (2025.01);
(Continued)

(58) Field of Classification Search
CPC .... H10D 99/00; H10D 30/6704; H10D 64/01; H10D 64/62; H10D 30/6755;
(Continued)

(56) References Cited

U.S. PATENT DOCUMENTS 8,063,421 B2 * 11/2011 Kang ................. H10D 30/6755
257/59
9,054,204 B2 * 6/2015 Oshima ................ H10D 30/031
(Continued)

FOREIGN PATENT DOCUMENTS

CN        102386237 A    3/2012
CN        102648526 A    8/2012
(Continued)

OTHER PUBLICATIONS

International Search Report and Written Opinion, mailed Dec. 9, 2020, from PCT/CN2020/080260.
(Continued)

*Primary Examiner* — Tan N Tran
(74) *Attorney, Agent, or Firm* — Workman Nydegger (57) ABSTRACT

Disclosed are a thin-film transistor and a preparation method therefor, and a display substrate and a display panel. The thin-film transistor includes: a base substrate; an active layer located on the base substrate; and a source-drain electrode which is located on the side of the active layer facing away from the base substrate, and includes an electrode layer and a protective layer, where the material of the electrode layer includes a first metal element; the protective layer covers the surface of the side of the electrode layer facing away from the base substrate, and a side face of the electrode layer; and (Continued)

the material of the protective layer is an oxide of the first metal element.

14 Claims, 4 Drawing Sheets

(51) Int. Cl.
*H10D 64/01* (2025.01)
*H10D 64/62* (2025.01)
*H01L 21/02* (2006.01)
*H01L 21/4763* (2006.01)

(52) U.S. Cl.
CPC ....... *H10D 64/62* (2025.01); *H01L 21/02175* (2013.01); *H01L 21/02178* (2013.01); *H01L 21/02244* (2013.01); *H01L 21/47635* (2013.01); *H10D 30/6755* (2025.01)

(58) Field of Classification Search
CPC .......... H10D 30/6729; H01L 21/02175; H01L 21/02178; H01L 21/02244; H01L 21/47635
See application file for complete search history.

(56) References Cited

U.S. PATENT DOCUMENTS

| | | | |
|---|---|---|---|
| 9,941,410 B2* | 4/2018 | Bae | H10D 30/6725 |
| 10,505,046 B2* | 12/2019 | Sone | G09G 3/38 |
| 10,916,661 B2* | 2/2021 | Uraoka | H10D 30/031 |
| 2011/0133191 A1 | 6/2011 | Yamazaki | |
| 2013/0126870 A1 | 5/2013 | Kou | |
| 2014/0091306 A1 | 4/2014 | Miki et al. | |
| 2014/0339537 A1 | 11/2014 | Bae | |
| 2015/0155362 A1 | 6/2015 | Nakazawa et al. | |
| 2015/0214376 A1 | 7/2015 | Koezuka et al. | |
| 2016/0197192 A1 | 7/2016 | Kang et al. | |
| 2017/0323907 A1 | 11/2017 | Kitagawa et al. | |
| 2019/0109159 A1 | 4/2019 | Kitagawa et al. | |

FOREIGN PATENT DOCUMENTS

| | | |
|---|---|---|
| CN | 103227206 A | 7/2013 |
| CN | 103503117 A | 1/2014 |
| CN | 104157693 A | 11/2014 |
| CN | 105097950 A | 11/2015 |
| CN | 107004719 A | 8/2017 |
| JP | 2015119174 A | 6/2015 |
| KR | 20040057714 A | 7/2004 |
| KR | 20080012490 A | 2/2008 |
| WO | 2012141089 A1 | 10/2012 |
| WO | 2013075355 A1 | 5/2013 |

OTHER PUBLICATIONS

Indian Examination Report, mailed Jan. 31, 2023, from India Patent App. No. 202227055097.
Chinese Office Action, mailed Jun. 9, 2022, from Chinese Patent App. No. 202080000327.2.
European extended Search Report, mailed Mar. 24, 2023, from European patent app. No. 20926348.2.
Chinese Second Office Action, mailed Sep. 5, 2023, from Chinese App. No. 202080000327.2.

* cited by examiner

THIN-FILM TRANSISTOR AND PREPARATION METHOD THEREFOR, AND DISPLAY SUBSTRATE AND DISPLAY PANEL

CROSS REFERENCE TO RELATED APPLICATIONS

The present disclosure is a US National Stage of International Application No. PCT/CN2020/080260, filed on Mar. 19, 2020, the entire content of which is incorporated herein by reference.

FIELD

The present application relates to the field of display, in particular to a thin-film transistor and a preparation method therefor, and a display substrate and a display panel.

BACKGROUND

In the field of semiconductor display, metal materials having relatively low resistivity and good electromigration resistance are generally selected as electrode materials in order to meet the development and requirements of large size, high resolution, and high-speed driving frequency of a display terminal, for example, Cu metal is often currently adopted as a material for a source-drain electrode of a thin-film transistor. However, a metal layer of the source-drain electrode is susceptible to subsequent preparation processes, so that splashed metal particles are formed and diffused into an active layer, e.g. using plasma bombardment in a passivation layer (PVX) preparation process allows metal particles of the source-drain electrode to splash down on a channel, leading to the conductivity of transistor characteristics and even failure of the entire device.

SUMMARY

The present application discloses a thin-film transistor and a preparation method therefor, and a display substrate and a display panel, which aims to improve the structure of the thin-film transistor, improve the characteristics of the thin-film transistor, and improve the yield of display products.

A thin-film transistor, including: a base substrate; an active layer located on the base substrate; and a source-drain electrode, which is located on a side, facing away from the base substrate, of the active layer, and includes an electrode layer and a protective layer; where a material of the electrode layer includes a first metal element; the protective layer covers a surface of a side, facing away from the base substrate, of the electrode layer, and a side face of the electrode layer; and a material of the protective layer is an oxide of the first metal element.

Optionally, the source-drain electrode further includes a transition layer located between the active layer and the electrode layer, where an orthographic projection of the transition layer on the base substrate overlaps with an orthographic projection of the electrode layer on the base substrate.

Optionally, the protective layer further covers a side face of the transition layer.

Optionally, the electrode layer is made of an alloy material; and the alloy material includes the first metal element.

Optionally, the material of the electrode layer includes a copper alloy.

Optionally, the first metal element is an aluminum element; and the material of the protective layer includes aluminum oxide.

Optionally, the first metal element is a chromium element; and the material of the protective layer includes chromium oxide.

Optionally, a mass percentage of the first metal element in the electrode layer is less than 0.5 wt. %.

Optionally, a ratio of a thickness of the protective layer to a thickness of the electrode layer ranges from 1/20 to 1/200.

Optionally, the active layer includes an undamaged layer close to the base substrate and a damaged layer far away from the base substrate; where an orthographic projection of the damaged layer on the base substrate does not overlap with an orthographic projection of a channel region of the thin-film transistor on the base substrate.

A display substrate, including any one thin-film transistor above.

A display panel, including the display substrate.

A preparation method for a thin-film transistor, including:
preparing and forming an active layer on a base substrate;
sequentially depositing a transition layer and an electrode layer of a source-drain electrode on the active layer, where the electrode layer includes a first metal element;
patterning the transition layer and the electrode layer by a patterning process to form a pattern of the source-drain electrode; and
oxidizing the source-drain electrode for forming a layer of an oxide film of the first metal element on a surface of the electrode layer.

Optionally, the electrode layer is made of a copper alloy, and the first metal element is aluminum or chromium; and
the oxidizing the source-drain electrode for forming the layer of the oxide film of the first metal element on the surface of the electrode layer specifically includes:
performing thermal annealing treatment on the electrode layer at an annealing temperature of higher than or equal to 300° C. for an annealing time of greater than or equal to 1 h under an atmosphere of air, for forming a layer of aluminum oxide film or chromium oxide film on the surface of the electrode layer.

Optionally, the sequentially depositing the transition layer and the electrode layer of the source-drain electrode on the active layer specifically includes: sequentially depositing the transition layer and the electrode layer by using a plasma sputtering deposition process while forming a damage layer on an upper surface of the active layer; and
the patterning the transition layer and the electrode layer by the patterning process to form the pattern of the source-drain electrode specifically includes: etching the transition layer and the electrode layer by an etching solution for an etch time of greater than or equal to (EPD+A/B), where EPD is the time required for the transition layer and the electrode layer to be etched exactly, A is a depth of a damaged layer in the active layer, and B is an etching rate of the damaged layer in the active layer by the etching solution.

DETAILED DESCRIPTION OF THE EMBODIMENTS

In the field of semiconductor TFT display, a metal layer of a source-drain electrode is susceptible to subsequent preparation processes, so that splashed metal particles are formed and diffused into an active layer, thereby affecting the performance of a device. For example, using plasma bombardment in a passivation layer (PVX) preparation process allows metal particles of the source-drain electrode to splash down, especially the metal particles are easily splashed on a side face of the source-drain electrode and diffused into the active layer, leading to the conductivity of transistor characteristics and even failure of the entire device, which generally appears as constantly brightened dots in a display product, with an incidence of about 80%. In particular, a metal element leading to the conductivity of the active layer can be obtained by both scanning transmission electron microscope (STEM) observation as well as energy dispersive X-ray spectroscopy (EDX) analysis; by taking the condition that a structure of a source-drain electrode of the TFT adopts B—MoNb/Cu/T-MoNb as an example, the metal element typically includes Mo, Nb and Cu.

In view of the above problems, the embodiments of the present application disclose a thin-film transistor and a preparation method therefor, and a display substrate and a display panel, which aims to improve the structure of the thin-film transistor, avoid metal particles of a source-drain electrode splashing into a channel region, and reduce poor conductivity of TFTs, then improve the characteristics of the thin-film transistor and improve the yield of display products.

The technical solutions in the embodiments of the present application will be clearly and fully described below with reference to the accompanying drawings in the embodiments of the present application, and obviously, the described embodiments are only some, but not all, embodiments of the present application. Based on the embodiments in the present application, all other embodiments obtained by those of ordinary skill in the art without inventive labor are intended to be within the scope of protection of the present application.

Figure 1:
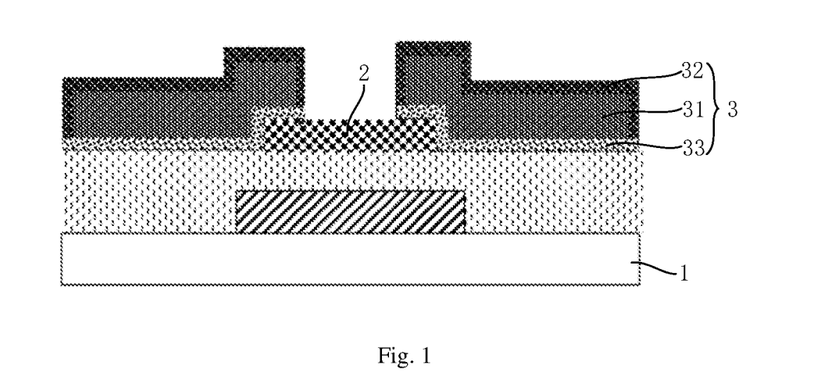
FIG. 1 is a schematic diagram of a partial cross-sectional structure of a thin-film transistor according to an embodiment of the present application.
Figure 4:
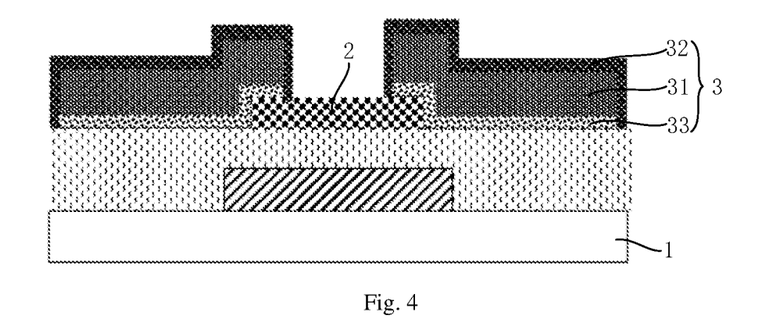
FIG. 4 is a schematic diagram of a partial cross-sectional structure of the thin-film transistor in FIG. 3 after a protective layer of a source-drain electrode is formed by oxidation treatment.
Figure 5:
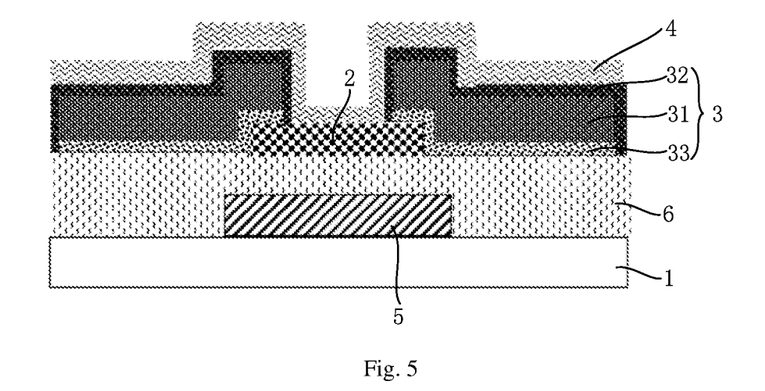
FIG. 5 is a schematic diagram of a partial cross-sectional structure of the thin-film transistor in FIG. 4 after a passivation layer is prepared and formed.

As shown in FIGS. 1, 4 and 5, the embodiments of the present application provide a thin-film transistor, including: a base substrate 1; an active layer 2 located on the base substrate 1; and a source-drain electrode 3, which is located on the side, facing away from the base substrate 1, of the active layer 2, and includes an electrode layer 31 and a protective layer 32; where a material of the electrode layer 31 includes a first metal element; the protective layer 32 covers a surface (an upper surface) of a side, facing away from the base substrate 1, of the electrode layer 31, and a side face of the electrode layer 31; and a material of the protective layer 32 is an oxide of the first metal element.

In particular, a 'side face' of a layer structure involved in this application refers to a partial surface located between an upper surface and a lower surface of the layer structure, or a surface of the layer structure extending along its thickness direction.

In the above thin-film transistor, the source-drain electrode 3 includes the electrode layer 31 and the protective layer 32; the material of the protective layer 32 is an oxide of a metal element, and the protective layer 32 covers an upper surface of the electrode layer 31 and a side face of the electrode layer 31, i.e. the protective layer 32 is a dense metal oxide covering the outer surface of the electrode layer 31. Thus, the protective layer 32 can completely protect the electrode layer 31 of the source-drain electrode 3 in a subsequent process (for example in a preparation process of a passivation layer 4), on one hand, further oxidation of the electrode layer 31 in the subsequent process can be avoided, and on the other hand, the problem of the conductivity of TFT characteristics caused by splashing of metal of the electrode layer 31 onto the active layer 2 due to plasma bombardment in the subsequent process can be avoided, so that the yield of TFTs can be improved. In addition, the material of the electrode layer 31 of the source-drain electrode 3 includes the first metal element, and the material of the protective layer 32 is an oxide of the first metal element; and then, a structure of the protective layer 32 can be obtained by directly performing oxidation treatment (e.g., high-temperature annealing treatment) on the electrode layer 31 of the source-drain electrode 3, and a preparation process such as plasma deposition is not required; so that the formation process of the protective layer 32 does not cause the metal of the electrode layer 31 to splash down, and problems such as the conductivity of TFT characteristics can be avoided.

To sum up, according to the above thin-film transistor, by forming the protective layer of the oxide of the first metal element on the surface of the electrode layer of the source-drain electrode, metal particles of the source-drain electrode can be prevented from splashing onto the channel region of TFT, reducing poor conductivity of TFT, thereby improving the characteristics of the thin-film transistor and improving the yield of display products.

In some embodiments, a ratio of a thickness of the protective layer 32 to a thickness of the electrode layer 31 ranges from 1/20 to 1/200.

Exemplarily, the electrode layer 31 may have a thickness of 200 nm to 1000 nm, and the protective layer 32 may have a thickness of 5 nm to 20 nm.

As shown in FIGS. 1, 4 and 5, in some embodiments, the source-drain electrode 3 further includes a transition layer 33 located between the active layer 2 and the electrode layer 31, and an orthographic projection of the transition layer 33 on the base substrate 1 overlaps with an orthographic projection of the electrode layer 31 on the base substrate 1.

Specifically, the material of the transition layer 33 includes insoluble metal such as titanium (Ti), molybdenum (Mo), and the like, or a metal alloy such as a molybdenum-niobium alloy (MoNb), molybdenum titanium nickel (MTD), and the like.

Specifically, the electrode layer 31 of the source-drain electrode 3 is generally made of a metal material having a low resistivity and good electromigration resistance, such as copper (Cu), so that the electrode layer 31 has poor adhesion to a film layer of a deposition substrate. By arranging the transition layer 33, the adhesion of the source-drain electrode 3 to the deposition substrate can be increased and the yield of TFTs can be increased. In addition, the transition layer 33 is located on the side, close to the base substrate 1, of the electrode layer 31, and arranging of the transition layer 33 can avoid oxidation of the surface of the side, close to the base substrate 1, of the electrode layer 31 to form an oxide layer, thereby ensuring migration efficiency of carrier and improving the yield of TFTs.

As shown in FIGS. 4 and 5, in some embodiments, in the source-drain electrode 3, the protective layer 32 further covers a side face of the transition layer 33, to prevent the problem of the conductivity of TFT characteristics caused by splashing of metal from the side face of the transition layer 33 onto the active layer 2 due to plasma bombardment in the subsequent process.

In particular, the thickness of the transition layer 33 (typically 10-30 nm) is relatively thin, just a few percent of the thickness of the electrode layer 31; the area of the side face is small; in the process of preparing and forming the protective layer 32, the effect that the protective layer 32 covers the outer surfaces of the electrode layer 31 and the transition layer 33 at the same time may be achieved by adjusting the process conditions of the oxidation treatment of the electrode layer 31 (for example, adjusting the conditions of the high-temperature annealing treatment) so that the first metal element in the electrode layer 31 can be diffused into the side face of the transition layer 33 and form an oxidation layer on the side face of the transition layer 33.

In some embodiments, the electrode layer 31 is made of an alloy material; and the alloy material includes the first metal element.

Exemplarily, the material of the electrode layer 31 includes a copper alloy, i.e. an alloy material with copper metal as a main element. Of course, the electrode layer 31 may also be made of an alloy with other metals as a main element, and the main metal element is generally required to have a lower resistivity and good electromigration resistance.

In particular, the first metal element may serve as an alloy element in the alloy material, and a metal element which is easy to diffuse and oxidize is generally selected.

Exemplarily, the first metal element may specifically be an aluminum (Al) element, and the material of the protective layer 32 includes aluminum oxide ($Al_2O_3$). For example, the electrode layer 31 may be made of a copper-aluminum alloy (CuAl), and the protective layer 32 is an aluminum oxide ($Al_2O_3$) film layer.

Exemplarily, the first metal element may specifically be a chromium (Cr) element; and the material of the protective layer 32 includes chromium oxide. For example, the electrode layer 31 may be made of a copper-chromium alloy (CuCr), and the protective layer 32 is a chromium oxide film layer.

Figure 2:
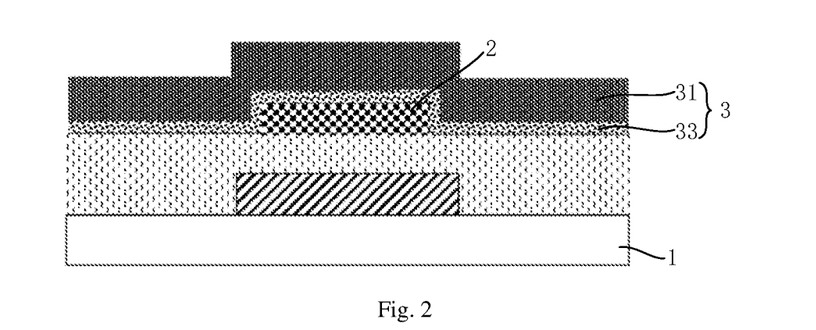
FIG. 2 is a schematic diagram of a partial cross-sectional structure of a thin-film transistor after each layer structure of a source-drain electrode is formed by deposition according to an embodiment of the present application.
Figure 3:
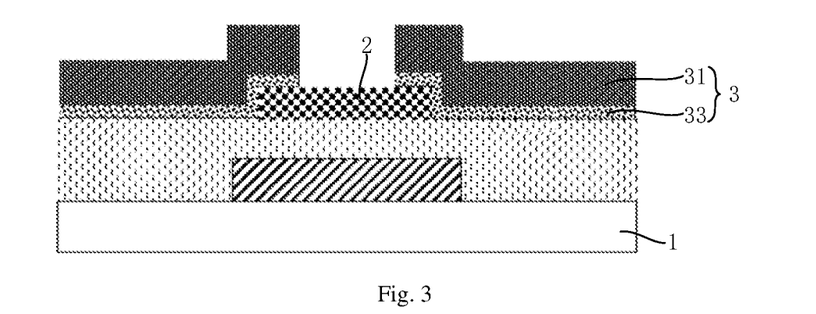
FIG. 3 is a schematic diagram of a partial cross-sectional structure of the thin-film transistor in FIG. 2 after a pattern of a source-drain electrode is formed by etching.

In particular, a transition layer and an electrode layer of a conventional source-drain electrode have poor adhesion to a photoresist (PR), undercut can occur after etching; and when the condition is severe, photoresist peeling (PR peeling) can occur, so as to affect the manufacturing yield and performance of the entire thin-film transistor. In the embodiments of the present application, as shown in FIG. 2 and FIG. 3, a layer structure in which patterning of the source-drain electrode 3 is required includes the transition layer 33 and the electrode layer 31 stacked in sequence; and the electrode layer 31 on the upper part is made of an alloy material, and has better adhesion to the PR, so as to avoid the problem of undercut or PR peeling during etching, and improve the manufacturing yield and performance of the entire thin-film transistor.

In particular, the electrode layer 31 adopts an alloy material, such as a copper alloy, and its alloy elements include a first metal element, such as aluminum (Al), and chromium (Cr). By utilizing self-diffusion characteristics of alloy elements in the alloy material, during thermal annealing, as shown in FIGS. 3 and 4, the first metal element can aggregate or diffuse towards the surface and interface of the electrode to form a dense oxide layer, i.e. to form the protective layer 32, so as to protect the electrode layer 31 of the source-drain electrode 3, and avoid the problem of the conductivity of TFT characteristics caused by splashing of metal of the electrode layer 31 onto the active layer 2 due to plasma bombardment in the subsequent process.

In some embodiments, a mass percentage of the alloy element can be set to be less than 0.5 wt. % in consideration of the effect of the alloy element in the alloy material on the resistivity of the overall alloy material. For example, a mass percentage of the first metal element in the alloy material is less than 0.5 wt. %.

Figure 7:
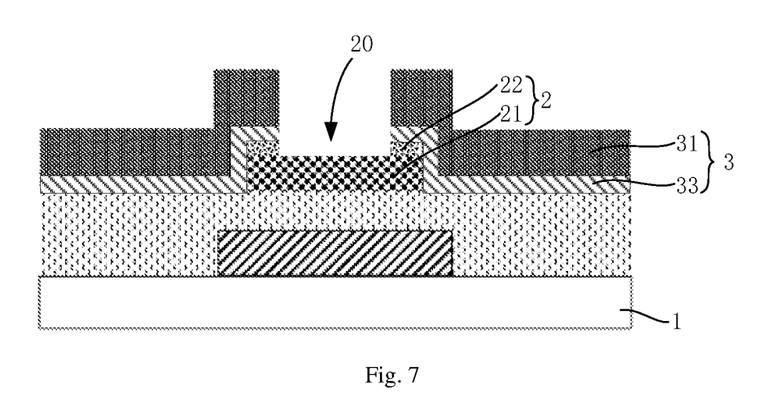
FIG. 7 is a schematic diagram of a partial cross-sectional structure of the thin-film transistor in FIG. 6 after a pattern of a source-drain electrode is formed by etching.

As shown in FIG. 7, in some embodiments, the active layer 2 includes an undamaged layer 21 close to the base substrate 1 and a damaged layer 22 far away from the base substrate 1, where an orthographic projection of the damaged layer 22 on the base substrate 1 does not overlap with an orthographic projection of a channel region 20 of the thin-film transistor on the base substrate 1.

Figure 6:
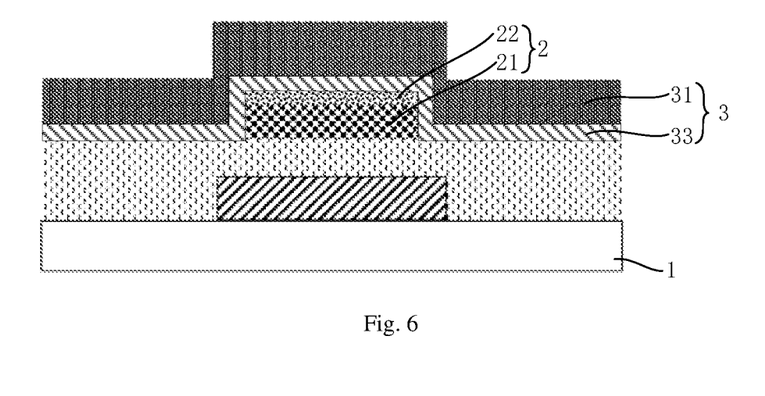
FIG. 6 is a schematic diagram of a partial cross-sectional structure of a thin-film transistor after each layer structure of a source-drain electrode is formed by deposition according to another embodiment of the present application.

Specifically, as shown in FIG. 6, after the active layer (an oxide semiconductor layer, OS) 2 is formed and when the layer structure of the source-drain electrode 3 is deposited (SD deposition), plasma bombardment may break In—O bonds in the OS, the damage layer 22 is formed on the OS surface, oxygen vacancies (Vo) are generated, and Vo and H in the OS film form VoH, so as to cause a threshold voltage (Vth) of an oxide thin-film transistor to be shifted negatively, and result in the conductivity. In this application, the orthographic projection of the damaged layer 22 does not overlap with the orthographic projection of the channel region 20, i.e., the overlapping portion of the damaged layer 22 and the channel region 20 is completely etched away, so that the problem of the conductivity of characteristics of the oxide thin-film transistor caused by the damaged layer 22 can be avoided.

In particular, the overlapping portion of the damaged layer 22 and the channel region 20 can be completely etched away during etching of the source-drain electrode 3, thereby simplifying the preparation process.

In particular, as shown in FIG. 5, the thin-film transistor provided by the embodiments of the present application may also include structures such as a gate 5, a gate insulator (GI) 6, and a passivation layer 4, which are conventional in thin-film transistors, and are not described in any further detail herein.

In particular, in the thin-film transistor provided by the embodiments of the present application, the base substrate can be flexible or rigid. A material of the gate can be a metal such as Mo, Al, Cu, and the like or an alloy thereof. The active layer can adopt an oxide semiconductor such as IGZO, IZO, GZO, and the like and can have a single layer structure, a stacked structure, or a multi-layer structure. The SD electrode may be a multi-layer composite structure and may be, for example, MoNb/CuAl/Al$_2$O$_3$, MoNb/CuCr/CrO$_x$, or the like. Of course, the materials described above are merely exemplary, and the materials of the layers are not limited thereto, and may be specifically determined according to actual needs.

Embodiments of the present application also provide a display substrate, including any one thin-film transistor above.

Embodiments of the present application also provide a display panel, including the above display substrate, and an opposite substrate.

Illustratively, the display panel can be the liquid crystal display (LCD), the display substrate is an array substrate, and the opposite substrate is a color film substrate. Or, the display panel may also be the organic light-emitting diode (OLED), the display substrate is a driving backplate, and the opposite substrate is a protective cover plate.

Embodiments of the present application also provide a display device, including the display panel.

Specifically, the display device can be applied to various electronic devices such as televisions, displays, tablet computers, and smartphones.

Figure 8:
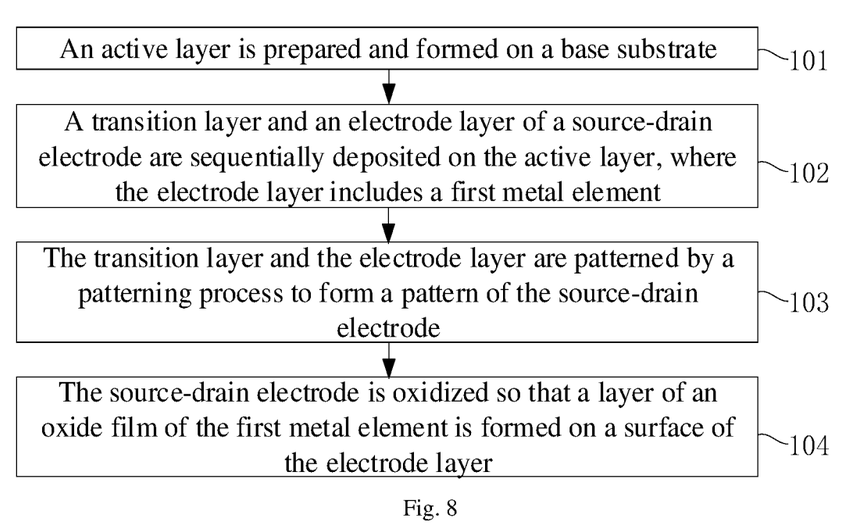
FIG. 8 is a flow diagram of a preparation method for a thin-film transistor according to an embodiment of the present application.

Additionally, based on the thin-film transistor provided by the present application, the present application also provides a preparation method for a thin-film transistor, and as shown in FIG. 8, the method includes the following.

Step 101, as shown in FIG. 2, an active layer 2 is prepared and formed on a base substrate 1.

Step 102, as shown in FIG. 2, a transition layer 33 and an electrode layer 31 of a source-drain electrode 3 are sequentially deposited on the active layer 2, where the electrode layer 31 includes a first metal element.

Step 103, as shown in FIG. 3, the transition layer 33 and the electrode layer 31 are patterned by a patterning process to form a pattern of the source-drain electrode 3.

Step 104, as shown in FIG. 4, the source-drain electrode 3 is oxidized so that a layer of an oxide film of the first metal element (i.e., a protective layer 32) is formed on a surface of the electrode layer 31.

In some embodiments, the electrode layer is made of a copper alloy, and the first metal element is aluminum or chromium.

The step 104 that the source-drain electrode is oxidized so that the layer of the oxide film of the first metal element is formed on the surface of the electrode layer specifically includes:

performing thermal annealing treatment on the electrode layer at an annealing temperature of higher than or equal to 300° C. for an annealing time of greater than or equal to 1 h under an atmosphere of air, for forming a layer of aluminum oxide film or chromium oxide film on the surface of the electrode layer.

In particular, by utilizing the self-diffusion characteristics of alloy elements in the alloy material, during thermal annealing, as shown in FIGS. 3 and 4, the first metal element (aluminum or chromium) in the copper alloy can aggregate or diffuse towards the surface and interface of the electrode to form a dense oxide layer, i.e. to form the protective layer 32, so as to protect the electrode layer 31 of the source-drain electrode 3, and avoid the problem of the conductivity of TFT characteristics caused by splashing of metal of the electrode layer 31 onto the active layer 2 due to plasma bombardment in the subsequent process.

In some embodiments, the step 102 that the transition layer and the electrode layer of the source-drain electrode are sequentially deposited on the active layer specifically includes:

as shown in FIG. 6, sequentially depositing the transition layer 33 and the electrode layer 31 by a using plasma sputtering deposition process while forming a damage layer 22 on an upper surface of the active layer 2.

Further, the step 103 that the transition layer and the electrode layer are patterned by the patterning process to form the pattern of the source-drain electrode specifically includes:

as shown in FIG. 7, etching the transitional layer 33 and the electrode layer 31 by an etching solution for an etch time of greater than or equal to (EPD+A/B), where EPD is the time required for the transition layer 33 and the electrode layer 31 to be etched exactly, A is a depth of a damaged layer 22 in the active layer 2, and B is an etching rate of a damaged layer 22 in the active layer 2 by the etching solution.

Specifically, as shown in FIG. 6, after the active layer (an oxide semiconductor layer, OS) 2 is formed and when the layer structure of the source-drain electrode 3 is deposited (SD deposition), plasma bombardment may break In—O bonds in the OS, the damage layer 22 is formed on the OS surface, oxygen vacancies (Vo) are generated, Vo and H in the OS film form VoH, so as to cause a threshold voltage (Vth) of an oxide thin-film transistor to be shifted negatively, and result in the conductivity.

In this application, the etch time for the source-drain electrode is set to form a standard etching specification. In particular, EPD is the time required for the transition layer and the electrode layer to be etched exactly, i.e. the time to etch exactly to form the pattern of the source-drain electrode; and by the parameters A and B, the over etch time=A/B, i.e. the time required to further etch the damaged layer in the active layer, can be obtained. By setting the actual etch time in the source-drain (SD) electrode etching process to etch time≥(EPD+A/B), the OS damage layer can be completely removed while the source-drain electrode is etched, thereby solving the problem of the conductivity of characteristics of the oxide thin-film transistor, which can greatly improve the performance of the oxide thin-film transistor.

Exemplarily, EPD is the time when the structure of the source-drain electrode is exactly etched, which is determined by the film layer properties of the source-drain electrode (thickness, film quality, etc.) and the system of the etching solution, and specifically can be obtained by experimental data analysis. In the related art, the time (EPD) when the structure of the source-drain electrode is exactly etched belongs to a conventional parameter and is not repeated here.

Illustratively, the parameter A (damage layer depth) is generally related to the deposition power, time, deposition thickness, etc. of the transition layer (e.g., MoNb) at the bottom of the source-drain electrode; and generally the greater the deposition power of the transition layer, the longer the time, the thicker the thickness, the greater A. Specifically, the parameter A can be calculated by a method such as testing OS sheet resistance, secondary ion mass spectroscopy (SIMS), and transmission electron microscope (TEM).

Exemplarily, the parameter B (damage layer E/R) is generally related to the etching solution and the density of a material of an active layer pattern, and can be obtained specifically by experimental data analysis.

Specifically, in this embodiment, the condition that a material of the active layer is IGZO, a material of the transition layer of the source-drain electrode is MoNb, and a material of the electrode layer is Cu is taken as an example. By taking the condition that an etching solution for SD adopts a $H_2O_2$-based F-containing Cu etching solution as an example, F ions can corrode OS and the OS damage layer are completely removed while the SD is etched. EPD=73 s, A=110 Å, B=2.6 Å/s, and over etch time=A/B=110/2.6=42 s under the conditions of this embodiment. Then, EPD+A/B=73 s+42 s=115 s. In an actual process, the actual etch time is controlled according to the standard of the etch time≥(EPD+A/B)=115 s, i.e. it can be ensured that the OS damage layer of the channel region is completely etched away.

Figure 9:
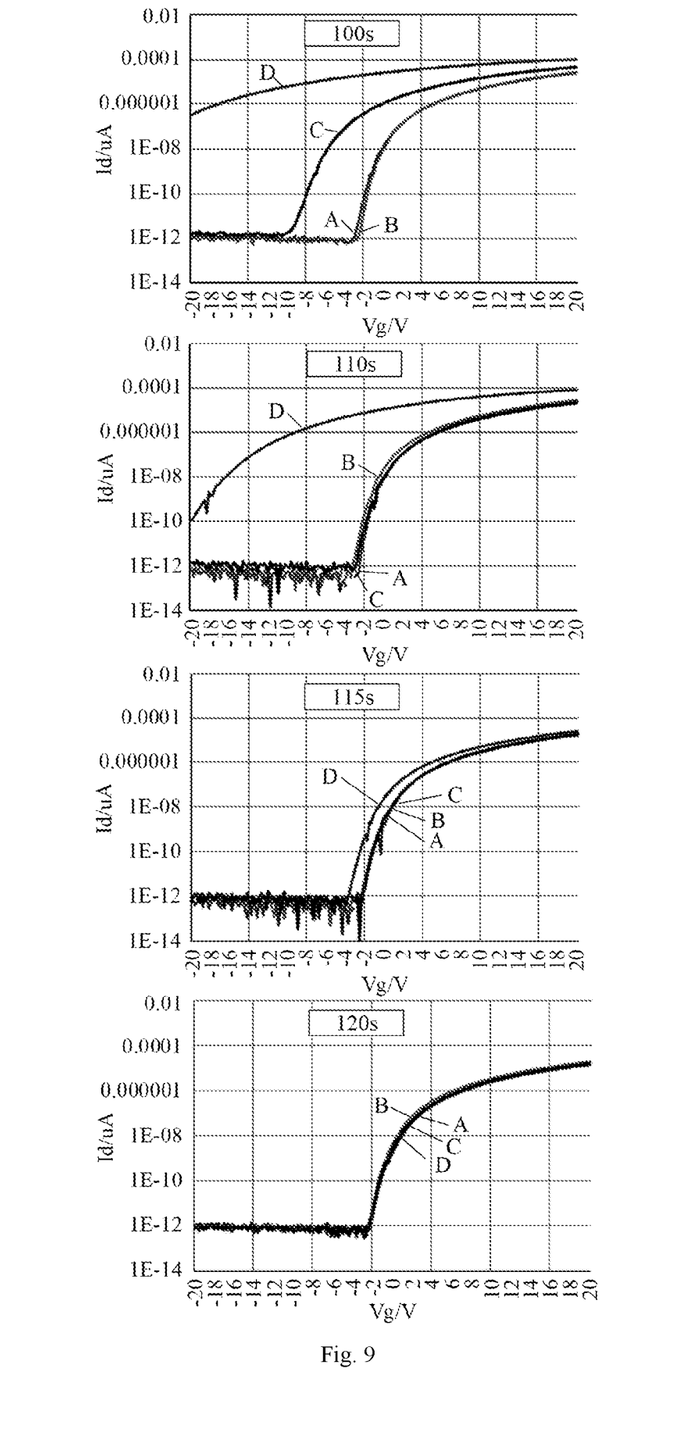
FIG. 9 is a schematic diagram of the comparison of characteristic curves of a thin-film transistor obtained under the condition of different etch times of a source-drain electrode.

FIG. 9 shows characteristic curves of TFT in a display substrate obtained by different etch times under the conditions of this embodiment. Specifically, the four figures in FIG. 9 are characteristic curves of TFT in a display substrate obtained by using four etch times of 100 s, 110 s, 115 s, 120 s, respectively, where the four curves A, B, C, and D included in each figure are characteristic curves of TFT at four different locations of the display substrate, respectively, Due to the limitations of the actual etching process, the etch depths at different locations of the display substrate may vary, and thus the characteristics of TFT at different locations may vary. The characteristic curves A, B, C, and D of TFT at four representative locations are specifically given in FIG. 9 to fully illustrate the TFT characteristics of the whole display substrate. By comparing the characteristic curves in the above four figures, it can be seen that the results of TFT characteristics in the display substrate obtained by different etch times are different; in particular, as the etch time increases, the tendency of the characteristic conductivity of TFT in the display substrate decrease; and when the actual etch time is greater than or equal to 115 s, for example, in the case of 115 s and 120 s in FIG. 9, the characteristics of TFT at each location in the display substrate can be normal, which is consistent with the formulation standard of the etch time set in the embodiments of the present application. Thus it can be seen that by using the etch time of the source-drain (SD) electrode provided in the embodiments as a standard, the OS damage layer of TFT in each part of the display substrate can be completely removed while the source-drain electrode is etched, thereby solving the problem of the conductivity of characteristics of the oxide thin-film transistor, and the performance of the display substrate can be greatly improved.

Exemplary, the preparation method for the thin-film transistor provided by the embodiments of the present application may further include the steps of preparing a gate, a gate insulator, and a passivation layer; and an overall process may generally include: sequentially manufacturing a gate 5, a gate insulator (GI) 6, an active layer 2, a metal source-drain (SD) electrode 3, and a passivation layer 4 on the base substrate 1, as shown in FIG. 5.

In particular, in the thin-film transistor provided by the embodiments of the present application, the base substrate can be flexible or rigid. A material of the gate can be a metal such as Mo, Al, Cu, and the like or an alloy thereof. The active layer can adopt an oxide semiconductor such as IGZO, IZO, GZO, and the like and can have a single layer structure, a stacked structure, or a multi-layer structure. The SD electrode may be a multi-layer composite structure and may be, for example, MoNb/CuAl/$Al_2O_3$, MoNb/CuCr/$CrO_x$, or the like. Of course, the materials described above are merely exemplary, and the materials of the layers are not limited thereto, and may be specifically determined according to actual needs.

It should be noted that in some embodiments of the present disclosure, the preparation method for the thin-film transistor may also include more steps, which can be determined according to the actual needs, and is not limited in the embodiments of the present disclosure, and its detailed description and technical effects can refer to the description of the thin-film transistor above, which will not be repeated here. In addition, the specific process method and preparation process for the steps 102, 103, and 104 in the preparation method for the thin-film transistor provided by the embodiments of the present disclosure are not limited to those in the embodiments given above, and the thin-film transistor may also be prepared by using other processes and steps, and reference may be made in particular to the description of the layer structures in the thin-film transistor above, which will not be repeated here.

Obviously, those skilled in the art can make various modifications and variations to the embodiments of the present application without departing from the spirit and scope of the present application. In this way, if these modifications and variations of the present application fall within the scope of the claims of the application and their equivalents, the present application is also intended to include these modifications and variations.

What is claimed is:

1. A thin-film transistor, comprising:
   a base substrate;
   an active layer arranged on the base substrate; and
   a source-drain electrode layer, which is arranged on a side, facing away from the base substrate, of the active layer, and comprises an electrode layer, a transition layer arranged between the active layer and the electrode layer, and a protective layer,
   wherein a material of the electrode layer comprises a first metal element, and a mass percentage of the first metal element in the electrode layer is less than 0.5 wt. %;
   the protective layer covers a surface of a side, facing away from the base substrate, of the electrode layer, and a side face of the electrode layer;
   a material of the protective layer is an oxide of the first metal element;
   an orthographic projection of the transition layer on the base substrate overlaps with an orthographic projection of the electrode layer on the base substrate.

2. The thin-film transistor according to claim 1, wherein the protective layer further covers a side face of the transition layer.

3. The thin-film transistor according to claim 1, wherein the electrode layer is made of an alloy material; and the alloy material comprises the first metal element.

4. The thin-film transistor according to claim 3, wherein the material of the electrode layer comprises a copper alloy.

5. The thin-film transistor according to claim 4, wherein the first metal element is an aluminum element; and the material of the protective layer comprises aluminum oxide.

6. The thin-film transistor according to claim 4, wherein the first metal element is a chromium element; and the material of the protective layer comprises chromium oxide.

7. The thin-film transistor according to claim 1, wherein a ratio of a thickness of the protective layer to a thickness of the electrode layer ranges from 1/20 to 1/200.

8. The thin-film transistor according to claim 1, wherein the active layer comprises: an undamaged layer close to the base substrate and a damaged layer far away from the base substrate;
   wherein an orthographic projection of the damaged layer on the base substrate does not overlap with an orthographic projection of a channel region of the thin-film transistor on the base substrate.

9. The thin-film transistor according to claim 8, wherein the orthographic projection of the damaged layer on the base substrate is on two sides of the orthographic projection of the channel region of the thin-film transistor on the base substrate.

10. A display substrate, comprising the thin-film transistor according to claim 1.

11. A display panel, comprising the display substrate according to claim 10.

12. A preparation method for the thin-film transistor according to claim 1, comprising:
   preparing and forming the active layer on the base substrate;
   sequentially depositing a transition layer and the electrode layer of the source-drain electrode layer on the active layer, wherein the electrode layer comprises the first metal element;
   patterning the transition layer and the electrode layer by a patterning process to form a pattern of the source-drain electrode layer; and
   oxidizing the source-drain electrode layer for forming a layer of an oxide film of the first metal element on a surface of the electrode layer.

13. The preparation method according to claim 12, wherein the electrode layer is made of a copper alloy, and the first metal element is aluminum or chromium;
   wherein the oxidizing the source-drain electrode layer for forming the layer of the oxide film of the first metal element on the surface of the electrode layer specifically comprises:
   performing thermal annealing treatment on the electrode layer at an annealing temperature of higher than or equal to 300° C. for an annealing time of greater than or equal to 1 h under an atmosphere of air, for forming a layer of aluminum oxide film or chromium oxide film on the surface of the electrode layer.

14. The preparation method according to claim 12, wherein the sequentially depositing the transition layer and the electrode layer of the source-drain electrode layer on the active layer specifically comprises:
   sequentially depositing the transition layer and the electrode layer by using a plasma sputtering deposition process while forming a damage layer on an upper surface of the active layer;
   wherein the patterning the transition layer and the electrode layer by the patterning process to form the pattern of the source-drain electrode layer specifically comprises:
      etching the transition layer and the electrode layer by an etching solution for an etch time of greater than or equal to (EPD+A/B), wherein EPD is a time required for the transition layer and the electrode layer to be etched exactly, A is a depth of a damaged layer in the active layer, and B is an etching rate of the damaged layer in the active layer by the etching solution.

* * * * *